US009811625B2

(12) United States Patent
Myers

(10) Patent No.: US 9,811,625 B2
(45) Date of Patent: Nov. 7, 2017

(54) COMPUTER-IMPLEMENTED METHOD AND COMPUTER PROGRAM FOR GENERATING A LAYOUT OF A CIRCUIT BLOCK OF AN INTEGRATED CIRCUIT

(71) Applicant: ARM LIMITED, Cambridge (GB)

(72) Inventor: James Edward Myers, Cambridge (GB)

(73) Assignee: ARM Limited, Cambridge (GB)

( * ) Notice: Subject to any disclaimer, the term of this patent is extended or adjusted under 35 U.S.C. 154(b) by 175 days.

(21) Appl. No.: 14/697,709

(22) Filed: Apr. 28, 2015

(65) Prior Publication Data
US 2016/0321389 A1 Nov. 3, 2016

(51) Int. Cl.
*G06F 17/50* (2006.01)
*H01L 27/092* (2006.01)
*H01L 27/02* (2006.01)

(52) U.S. Cl.
CPC ...... *G06F 17/5072* (2013.01); *G06F 17/5077* (2013.01); *H01L 27/0207* (2013.01); *H01L 27/092* (2013.01)

(58) Field of Classification Search
USPC ........................................................ 716/122
See application file for complete search history.

(56) References Cited

U.S. PATENT DOCUMENTS

| | | | |
|---|---|---|---|
| 2004/0140483 A1* | 7/2004 | Yonemaru | H01L 27/0207 257/204 |
| 2010/0134149 A1* | 6/2010 | Bol | H03K 19/00361 326/103 |

(Continued)

OTHER PUBLICATIONS

Ananthan et al., "Larger-than-Vdd Forward Body Bias in Sub-0.5V Nanoscale CMOS", Proceedings of the 2004 Int'l Symposium on Low Power Electronic and Design, Aug. 2004, 6 pages.

(Continued)

*Primary Examiner* — Brian Ngo
(74) *Attorney, Agent, or Firm* — Nixon & Vanderhye P.C.

(57) ABSTRACT

A computer implemented method and a computer program for generating a layout of a circuit block of an integrated circuit are provided. Input data is received identifying a plurality of circuit elements and interconnections required to implement the circuit block, and the method also has access to a cell library providing a plurality of standard cells, where each standard cell defines a corresponding circuit element using transistors, the transistors comprising n-type transistors and p-type transistors. A plurality of rows are formed within which to place standard cells from the cell library in order to implement the circuit block, the plurality of rows including at least one body biased row in which a body bias is to be applied in respect of either the n-type transistors or the p-type transistors provided by the standard cells placed in that body biased row. Constraint data is specified identifying a subset of the standard cells that are allowed to be placed in each body biased row, and the layout is then generated by placing standard cells within the plurality of rows having regard to the input data, an indication of each body biased row, and the constraint data for each body biased row. This enables a significant improvement in the benefits that can be achieved through the use of body biasing mechanisms, for example allowing a significant increase in switching speed of the circuit block to be achieved, without a significant increase in leakage current.

22 Claims, 8 Drawing Sheets

(56) References Cited

U.S. PATENT DOCUMENTS

| | | | |
|---|---|---|---|
| 2013/0222049 A1* | 8/2013 | Lee | H03K 17/22 327/534 |
| 2014/0032949 A1* | 1/2014 | Kim | G06F 1/3206 713/322 |
| 2015/0302917 A1* | 10/2015 | Grover | G11C 11/412 365/51 |
| 2016/0026207 A1* | 1/2016 | Boling | G05F 3/205 327/537 |

OTHER PUBLICATIONS

Kakoee et al., "*Fine-Grained Power and Body-Bias Control for Near-Threshold Deep Sub-Micron CMOS Circuits*", IEEE Transactions on Emerging and Selected Topics in Credits and Systems, vol. 1, No. 2, Jun. 2011, 10 pages.

\* cited by examiner

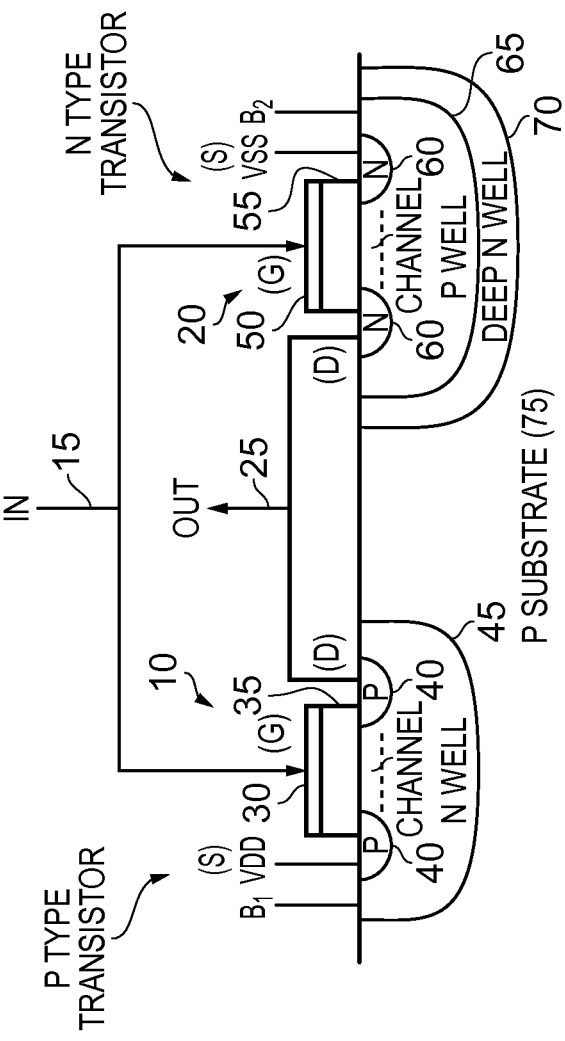
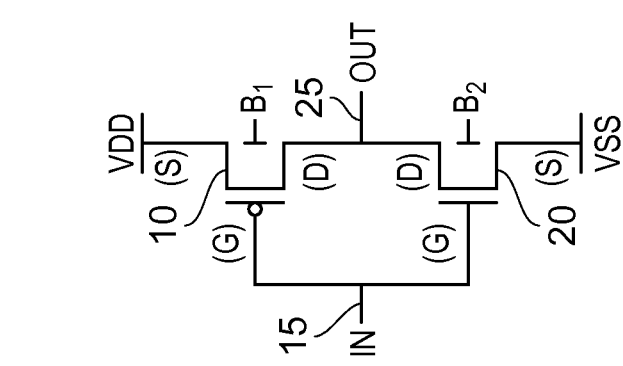

FBB NWELL ROWS TO IMPROVE RISING EDGE TRANSITION TIMES

COMPUTER-IMPLEMENTED METHOD AND COMPUTER PROGRAM FOR GENERATING A LAYOUT OF A CIRCUIT BLOCK OF AN INTEGRATED CIRCUIT

BACKGROUND

The present invention relates to the field of integrated circuits, and in particular to techniques for generating the layout of a circuit block for such an integrated circuit. The circuit block may represent the entire integrated circuit or a component within the integrated circuit.

In the design of semiconductor integrated circuits, it is known to provide automated tools which use a functional design of a planned circuit block (for example in the form of a gate level netlist or a Register Transfer Level representation of the design) and a cell library providing a set of standard cells (the standard cells defining circuit elements, and being "building blocks" for putting together the layout of the circuit block according to the functional design) in order to generate the layout of the circuit block.

Typically, the standard cells are arranged in rows by the automated tool and (considering the rows as running horizontally) the left and right boundaries of each standard cell are such that any given standard cell may be placed next to any other given standard cell. Thus the automated tool typically has free choice in which standard cells are placed where in order to fulfil the requirements of the functional design with a low routing overhead.

Each standard cell in the standard cell library will typically define a corresponding circuit element using transistors. Many types of transistors used in modern systems include a body region, and a known technique to increase the switching speed of such transistors is to apply forward body biasing (FBB) to those transistors. However, whilst this can serve to increase the switching speed of the transistors, it also typically has the side effect of increasing the leakage power of the transistors. Another type of body biasing that can be applied is reverse body biasing (RBB), which can reduce leakage current of the transistor, but has an impact on switching speed.

It would be desirable to improve the benefits derivable from body biasing techniques when designing circuit blocks of an integrated circuit using the earlier-mentioned standard cell approach.

SUMMARY

In one example configuration, there is provided a computer-implemented method of generating a layout of a circuit block of an integrated circuit, comprising: receiving input data identifying a plurality of circuit elements and interconnections required to implement the circuit block; accessing a cell library providing a plurality of standard cells, each standard cell defining a corresponding circuit element using transistors, the transistors comprising n-type transistors and p-type transistors; forming a plurality of rows within which to place standard cells from the cell library in order to implement the circuit block, said plurality of rows including at least one body biased row in which a body bias is to be applied in respect of one type of the n-type transistors and the p-type transistors provided by the standard cells placed in that body biased row; specifying constraint data identifying a subset of the standard cells that are allowed to be placed in each body biased row; and generating said layout by placing standard cells within the plurality of rows having regard to the input data, an indication of each body biased row and the constraint data for each body biased row.

In another example configuration, there is provided a computer program product on a non-transitory storage medium for controlling a computer to perform a method of generating a layout of a circuit block in accordance with the above mentioned example configuration.

In a yet further example configuration, there is provided a non-transitory storage medium storing a cell library comprising a plurality of standard cells, each standard cell defining a corresponding circuit element using transistors, the transistors comprising n-type transistors and p-type transistors, the standard cell library including at least one standard cell constrained to be used in a body biased row of a plurality of rows to be populated with standard cells from the cell library in order to implement a circuit block, the body biased row being a row in which a body bias is to be applied in respect of one type of the n-type transistors and the p-type transistors provided by standard cells placed in that body biased row.

In a further example configuration, there is provided an integrated circuit comprising: at least one circuit block comprising a plurality of circuit elements formed from standard cells of a cell library and positioned within a plurality of rows, the circuit elements comprising p-type transistors and n-type transistors; said plurality of rows including at least one body biased row in which a body bias is applied in respect of one type of the n-type transistors and the p-type transistors provided by the circuit elements positioned in that body biased row; and each body biased row containing only circuit elements formed from standard cells within a subset of the standard cells that are constrained to be placed in that body biased row.

BRIEF DESCRIPTION OF THE DRAWINGS

The present technique will be described further, by way of example only, with reference to embodiments thereof as illustrated in the accompanying drawings, in which:

FIGS. 1A and 1B illustrate various well structures that may be provided in association with transistors, considering the specific example of an inverter circuit comprising both a PMOS transistor and an NMOS transistor;

DESCRIPTION OF EMBODIMENTS

Figure 2A:
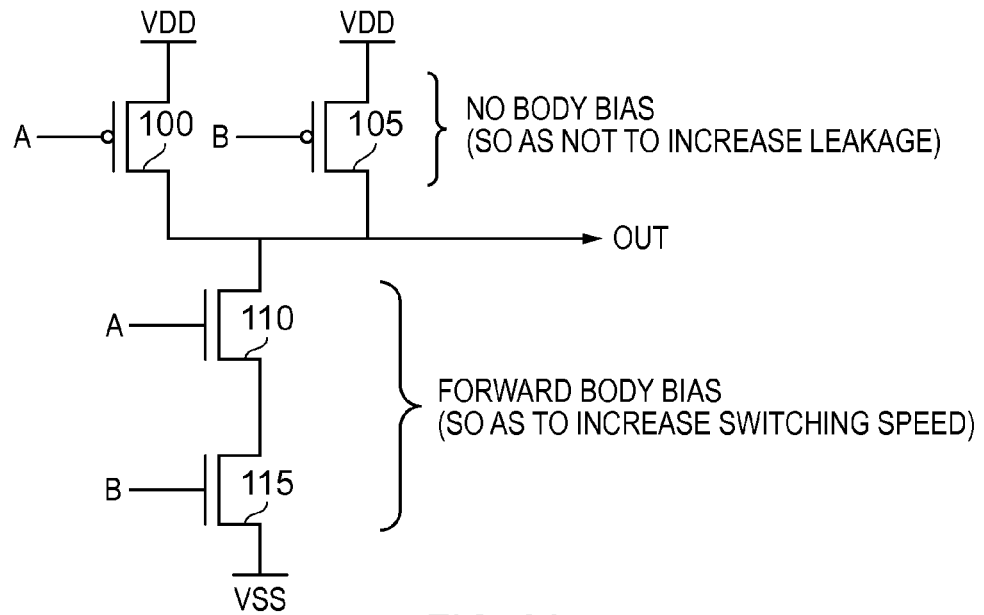
FIGS. 2A and 2B illustrate the construction of a NAND gate and a NOR gate, respectively using PMOS and NMOS transistors.

Before discussing the embodiments with reference to the accompanying figures, the following description of embodiments is provided.

In one embodiment a computer implemented method of generating a layout of a circuit block of an integrated circuit is provided, that uses both input data identifying a plurality of circuit elements and interconnections required to implement the circuit block, and a cell library providing a plurality of standard cells. Each standard cell defines a corresponding circuit element using transistors, with the transistors comprising n-type transistors and p-type transistors. The method involves forming a plurality of rows within which to place standard cells from the cell library in order to implement the circuit block. The plurality of rows are arranged to include at least one body biased row in which a body bias is to be applied in respect of one type of transistor (i.e. either the n-type transistors or the p-type transistors) provided by the standard cells placed in that body biased row. Further, constraint data is specified identifying a subset of the standard cells that are allowed to be placed in each body biased row. Then, the method generates the layout by placing standard cells within the plurality of rows having regard to the input data, an indication of each body biased row, and the constraint data for each body biased row.

Hence, in such embodiments, certain body biased rows are identified prior to standard cell placement taking place, and those body biased rows are arranged to have a body bias applied only in respect of one of the n-type transistors or the p-type transistors. Further, only a subset of the standard cells can be placed in those identified body biased rows. Hence, a particular subset of the standard cells can be identified that will achieve a particular desired benefit from being placed within such a body biased row. At the time of laying out the various standard cells within the rows, these factors can then be taken into account in order to produce a layout that improves the benefits achievable from the body biasing mechanisms. For example, it is possible in one embodiment to significantly improve switching speed without significantly impacting leakage current. Alternatively, it may be possible to generate a layout which reduces leakage current without any significant impact on switching speed.

The subset of standard cells that are specified by the constraint data can take a variety of forms. However, in one embodiment the constraint data identifies as the subset of standard cells at least one standard cell that includes a series of transistors of said one type that are arranged in a stacked arrangement within the standard cell. In particular, it has been found that in standard cells that include transistors of one type arranged in a stacked arrangement (i.e. in series) and include other transistors that are arranged in parallel, it is the series of transistors in the stacked arrangement that significantly limit the switching speed of the circuit element. In contrast, the transistors that are placed in parallel are the ones that contribute most to the leakage current. Accordingly, by limiting the body biasing to the transistors in the stacked arrangement, this can significantly increase switching speeds for the circuit element, but without a significant increase in leakage current. By identifying in advance a subset of the standard cells of this type, then during the layout generation process the relevant body biased row can be populated with such standard cells, in order to allow a circuit block to be designed having significantly increased switching speeds with only a modest increase in leakage current.

However, there are also other arrangements of transistors within standard cells that can benefit from the above approach. For example, in one embodiment the constraint data identifies as the subset of standard cells at least one standard cell used as a circuit element within a clock distribution tree used to propagate a clock signal. In particular, within a clock distribution tree it is often desirable to improve the rising edge transition times in order to improve robustness. By constraining the circuit elements used within the clock distribution tree to reside within a suitably body biased row, such that the transistors of one type within each such circuit element are body biased whilst the transistors of the other type are not, this can enable the rising edge transition times to be decreased without significantly increasing leakage current.

Whilst the above described techniques may be used in association with reverse body biased rows in order to reduce leakage current without a significant switching speed impact, in one embodiment the body bias to be applied within each body bias row is a forward body bias, in order to enable switching speeds of transistors to be increased without a significant increase in leakage current. The body biased rows can take a variety of forms. In one embodiment, the at least one body biased row comprises a p-type body biased row in which a body bias is to be applied in respect of the p-type transistors provided by standard cells placed in that p-type body biased row, and no body bias is to be applied in respect of the n-type transistors provided by standard cells placed in that p-type body biased row. In one embodiment, this is achieved by applying a forward body bias to an n-well region within which the p-type transistors are formed.

In one such embodiment, the subset of standard cells identified by the constraint data comprises at least one standard cell that includes a series of p-type transistors that are arranged in a stacked arrangement within that standard cell. A particular example of a standard cell that includes a series of p-type transistors arranged in a stacked arrangement is a standard cell representing a NOR gate.

In some embodiments, a dedicated analog bias voltage may be provided for biasing the relevant well region, for example the n-well region for a p-type body biased row. However, many modern integrated circuits are designed to operate at near or sub-threshold operating voltages in order to improve energy efficiency, and in such situations it is possible to use one of the existing power or ground rails in order to achieve the required forward biasing. For example, considering the p-type body biased row mentioned above, the body bias may be applied by providing a reference voltage level (for example a ground voltage level) to a body connection of the p-type transistors within the p-type body biased row.

In an alternative embodiment, the at least one body biased row comprises an n-type body biased row in which a body bias is to be applied in respect of the n-type transistors provided by standard cells placed in that n-type body biased row, and no body bias is to be applied in respect of the p-type transistors provided by standard cells placed in that n-type body biased row.

In a yet further embodiment, the layout may include multiple body biased rows, some of which may be the earlier described p-type body biased row, and some of which may be the earlier described n-type body biased rows. Typically, there will also be a number of rows that are arranged to have no body bias applied, and indeed there can be additional rows that are arranged to have body biasing applied in respect of both p-type and n-type transistors.

Considering the above mentioned n-type body biased row, then in one particular embodiment the subset of the standard cells identified by the constraint data comprises at least one standard cell that includes a series of n-types transistors that are arranged in a stacked arrangement within that standard cell. A particular example of such a standard cell that includes a series of stacked n-type transistors is a standard cell representing a NAND gate.

As mentioned earlier, a dedicated analog bias voltage can be provided for the body biased row, but when operating at near or sub-threshold operating voltages it is possible to use the existing power or ground voltage supplies for that purpose. In particular, for the above mentioned n-type body biased row, the body bias may be applied by the providing a supply voltage level (for example VDD) to a body connection of the n-type transistors within the n-type body biased row. In particular, in one embodiment the supply voltage may be provided to the p-well in which the n-type transistors are formed, in order to achieve the required forward body bias.

The input data can take a variety of forms, but in one embodiment the input data identifies for each circuit element the standard cell within the standard cell library to be used for that circuit element. It is often the case that a standard cell library may have more than one standard cell for a particular circuit element. For example, there may be multiple standard cells defining different NAND gates. These may be NAND gates with different drive strengths for example, but also in accordance with the above mentioned embodiments there may be specific standard cells to be used in body biased rows. In such situations, the input data will actually identify the individual standard cells to be used, and hence will identify where standard cells associated with body biased rows are needed.

Accordingly, in one such embodiment, the constraint data is effectively specified within the standard cell library by provision of one or more standard cells that are constrained to be used in the at least one body biased row. In particular, once the layout tool knows the location of the body biased rows, it can ensure that any such standard cells are placed within those body biased rows during the place and route operation.

In an alternative embodiment, the standard cell library may not include specific body biased variants of standard cells, but instead the constraint data may be specified by user input. For example, user input from the layout designer may specify that NAND gates are to be placed in particular body biased rows, and NOR gates are to be placed in other particular body biased rows.

In one embodiment, the constraint data may merely identify that the subset of standard cells are allowed to be placed in each body biased row. This means that standard cells that are not within the subset cannot be placed in the body biased row, but does not in itself require that all instances of the standard cells within the subset are actually placed in the body biased row. This could allow some flexibility, for example where it is proving difficult to provide the required routing between components when restricting all instances of particular standard cells to be placed within certain body biased rows.

However, in an alternative embodiment the constraint data may instead identify that all instances of the subset of standard cells must be placed within said at least one body biased row.

There are a number of ways in which the process may decide where to place the body biased rows within the plurality of rows to be used to implement the circuit block. In one embodiment, the step of forming a plurality of rows within which to place standard cells from the cell library in order to implement the circuit block comprises: repeating in a regular pattern a multiple of two p-type body biased rows and a multiple of two n-type body biased rows separated by one or more non-biased rows. Often, to simplify the routing of power and ground rails, a flip orientation is used where the orientation of adjacent rows is flipped, so that adjacent rows may either share a reference (ground) voltage rail, or share a supply voltage rail. When using such an arrangement, it is useful for the body biased rows to be arranged in multiples of two. The number of non-biased rows provided in the repeating regular pattern can be varied as desired. As also mentioned earlier, it is possible to incorporate within the regular pattern one or more body biased rows where both p-type and n-type body biasing is applied, if desired.

In one embodiment, the method further comprises the additional steps of incorporating the layout of the circuit block within a layout of an integrated circuit, and manufacturing the integrated circuit from the layout of the integrated circuit. Accordingly, when the layout of the circuit block has been generated, it can be incorporated within the layout of an integrated circuit, and then the integrated circuit can be manufactured from the layout. In some embodiments, the circuit block may form the entirety of the integrated circuit, whilst in other embodiments it may form a constituent part of the integrated circuit.

Whilst in one embodiment it may be arranged that each body biased row will always receive the determined body bias in respect of either the n-type transistors or the p-type transistors provided by the standard cells placed within that body biased row, in an alternative embodiment the design may be configured to allow the body bias to be selectively disabled in certain situations. For example, in one embodiment the method further comprises associating configuration circuitry with the at least one body biased row to enable application of the body bias to be disabled in response to at least one predetermined condition. The predetermined condition can take a variety of forms, but in one embodiment comprises an operating voltage exceeding a predetermined level and/or a power gating operation being applied to said at least one circuit block.

By such an approach, if it is desired to operate the circuit block at an operating voltage above a certain level, for example at above the near or sub-threshold operating voltages, the body biasing can be turned off. For example, considering the full forward-bias embodiment, it is desirable to disable forward body biasing when scaling the voltage above such near or sub-threshold operating voltages, as otherwise it is possible to cause damage to the integrated circuit by large substrate currents and/or latchup.

As another example, it is possible to disable the body biasing when a power gating operation is being performed, for example when the circuit block is being clock gated such that the clock signal to the circuit block is stopped for a period of time. During such a period of time, it would be desirable to disable forward body biasing, as during that period of time the forward body biasing will be contributing to leakage current, without any improvement in switching speed being observed due to the circuit block being turned off.

In one embodiment, a computer can be arranged to execute a computer program in order to perform the above described methods for generating a layout of the circuit block.

In one embodiment, a cell library can be provided that comprises a plurality of standard cells, each standard cell defining a corresponding circuit element using transistors, the transistors comprising n-type transistors and p-type transistors, the standard cell library including at least one standard cell constrained to be used in a body biased row of a plurality of rows to be populated with standard cells from the cell library in order to implement a circuit block, the body biased row being a row in which a body bias is to be applied in respect of one type of the n-type transistors and the p-type transistors provided by standard cells placed in that body biased row.

As a result of employing the above described methods, an integrated circuit can be produced that comprises at least one circuit block comprising a plurality of circuit elements formed from standard cells of a cell library and positioned within a plurality of rows, the circuit elements comprising p-type transistors and n-type transistors. The plurality of rows may include at least one body biased row in which a body bias is applied in respect of one type of the n-type transistors and the p-type transistors provided by the circuit elements positioned in that body biased row. Each body biased row contains only circuit elements formed from standard cells within a subset of the standard cells that are constrained to be placed in that body biased row.

In one embodiment the integrated circuit may further comprise configuration circuitry responsive to at least one predetermined condition to disable the body bias applied to the at least one body biased row. The at least one predetermined condition can take a variety of forms but in one embodiment may comprises an operating voltage exceeding a predetermined level, and/or a power gating operation being applied to said at least one circuit block.

Particular embodiments will now be described with reference to the figures.

FIG. 1A is a diagram schematically illustrating an inverter circuit element in accordance with one embodiment, this being an example of a circuit element that may be defined by a standard cell in a standard cell library for a place and route tool to then utilise when generating a layout of a circuit block for an integrated circuit. The inverter comprises a p-type transistor 10 connected in series with an n-type transistor 20 between a supply voltage VDD and a reference, or ground, voltage VSS. Each transistor has a source (S), gate (G) and drain (D) as shown in FIG. 1A, with the input signal over path 15 being provided to the gates of both transistors 10, 20, and with the output from the inverter being provided over path 25 from the node interconnecting the drain of the transistor 10 with the drain of the transistor 20.

In the embodiments described herein, the transistors are of the type having a body region, to which corresponding body connections $B_1$ and $B_2$ can be made, as shown schematically in FIG. 1A. Although there are various types of transistors that include such body regions, for the purposes of the following discussion it will be assumed that the transistors are metal oxide semiconductor (MOS) transistors and hence transistor 10 is a PMOS transistor and transistor 20 is an NMOS transistor.

FIG. 1B illustrates in cross-section how the PMOS transistor 10 and NMOS transistor 20 are formed on a substrate. In the illustrated example, the substrate is a p-type substrate 75, within which an n-well 45 is formed for the PMOS device 10. P-type source and drain regions 40 are then formed in the n-well 45. A polysilicon layer 30 is provided that at least partly overlaps the source and drain regions 40, and is separated from the source and drain regions by an oxide layer 35. The n-well provides a channel region between the source and drain regions 40.

The n-type device 20 is constructed similarly, but uses n-type source and drain regions 60 located within a p-well 65. Given that the substrate is also of a p-type, a deep n-well 70 is formed to separate the p-well 65 from the substrate 75. A polysilicon gate layer 50 is then provided over an oxide layer 55 extending between the source and drain regions 60.

The PMOS transistor 10 and NMOS transistor 20 shown in FIG. 1B are connected so as to implement the inverter functionality shown in FIG. 1A. As shown, a bias voltage $B_1$ can be provided to the n-well 45, and similarly a bias voltage $B_2$ can be applied to the p-well 65. When no body biasing is desired, the connection $B_1$ can be connected to the supply voltage VDD, and similarly the connection $B_2$ can be connected to the ground voltage VSS. However, in order to increase switching speed, a forward body bias can be created by application of suitable voltages to the terminals $B_1$ and $B_2$. In particular, a voltage less than the supply voltage VDD can be applied to the terminal $B_1$, and a voltage greater than the ground voltage VSS can be applied to the terminal $B_2$ in order to achieve forward biasing. If instead it is desired to reduce leakage current (at the expense of some decrease in switching speed), then the voltage applied to the connection $B_1$ can be increased above the supply voltage VDD, and similarly the voltage applied to the terminal $B_2$ can be reduced below the ground voltage VSS.

Whilst two dedicated analog bias voltages can be provided for provision to the terminals $B_1$ and $B_2$, it can be troublesome to generate and carefully manage those dedicated analog voltages, and in addition the bias voltage generation circuits themselves can give rise to significant power overheads. However, when operating at near or sub-threshold operating voltages, the forward bias mechanism can be implemented using the VDD and VSS supplies directly. In particular, if the connection $B_1$ is connected to VSS, this will fully forward bias the p-type transistors placed in the n-well 45. Similarly, if the connection $B_2$ is connected to VDD, this will fully forward bias the NMOS transistors provided in the p-well 65.

Whilst the above body bias mechanisms can be implemented in respect of both the n-well 45 and the p-well 65, it is also possible to body bias only one of the two wells. In the embodiments described herein, particular rows within which standard cells can be placed will be arranged to be body biased in such a manner (and are referred to herein as body biased rows), so that only one type of the transistors placed within that row (either the n-type transistors or the p-type transistors) will be body biased.

In one embodiment, a subset of standard cells are identified that are allowed to be placed in such a body biased row. In particular, in one embodiment that subset comprises standard cells representing circuit elements that use a stacked arrangement of transistors of a particular type. This is illustrated by way of example with reference to FIGS. 2A and 2B which show a NAND circuit element and a NOR circuit element, respectively. The NAND circuit element consists of two PMOS transistors 100, 105 in parallel, coupled to two NMOS transistors 110, 115 having a stacked arrangement (i.e. connected in series). The inventors noted that it is the stacked transistors that strongly limit switching speeds, whilst the parallel transistors dominate leakage current within the circuit element. By only forward body biasing the stacked NMOS transistors, and not the PMOS transistors, within the NAND circuit element, a significant speed-up in switching speeds can be achieved, with only a very modest increase in leakage current.

Figure 2B:
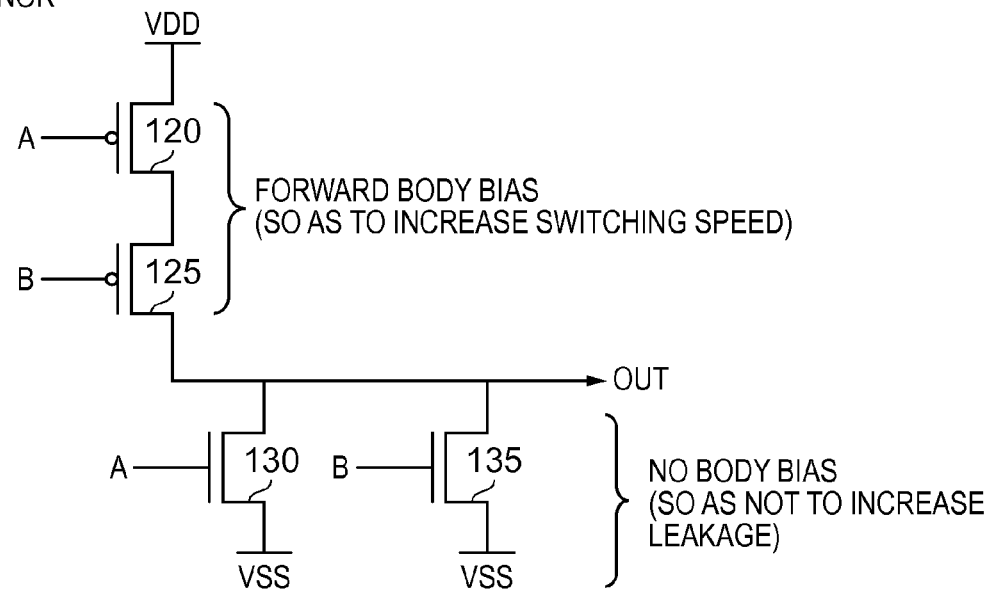

FIG. 2B illustrates a NOR gate, which consists of multiple PMOS transistors 120, 125 in a stacked arrangement between the supply voltage and the output node, along with a number of NMOS transistors 130, 135 placed in parallel between the output node and the ground supply. Again it is noted that if only the stacked transistors (in this case the PMOS transistors) are forward body biased, and the NMOS transistors are not, this can give rise to a significant increase in switching speed, but with only a very modest increase in leakage current. Again, this is due to the fact that the stacked transistors strongly limit switching speeds, whilst the parallel transistors dominate leakage current.

Figure 3:
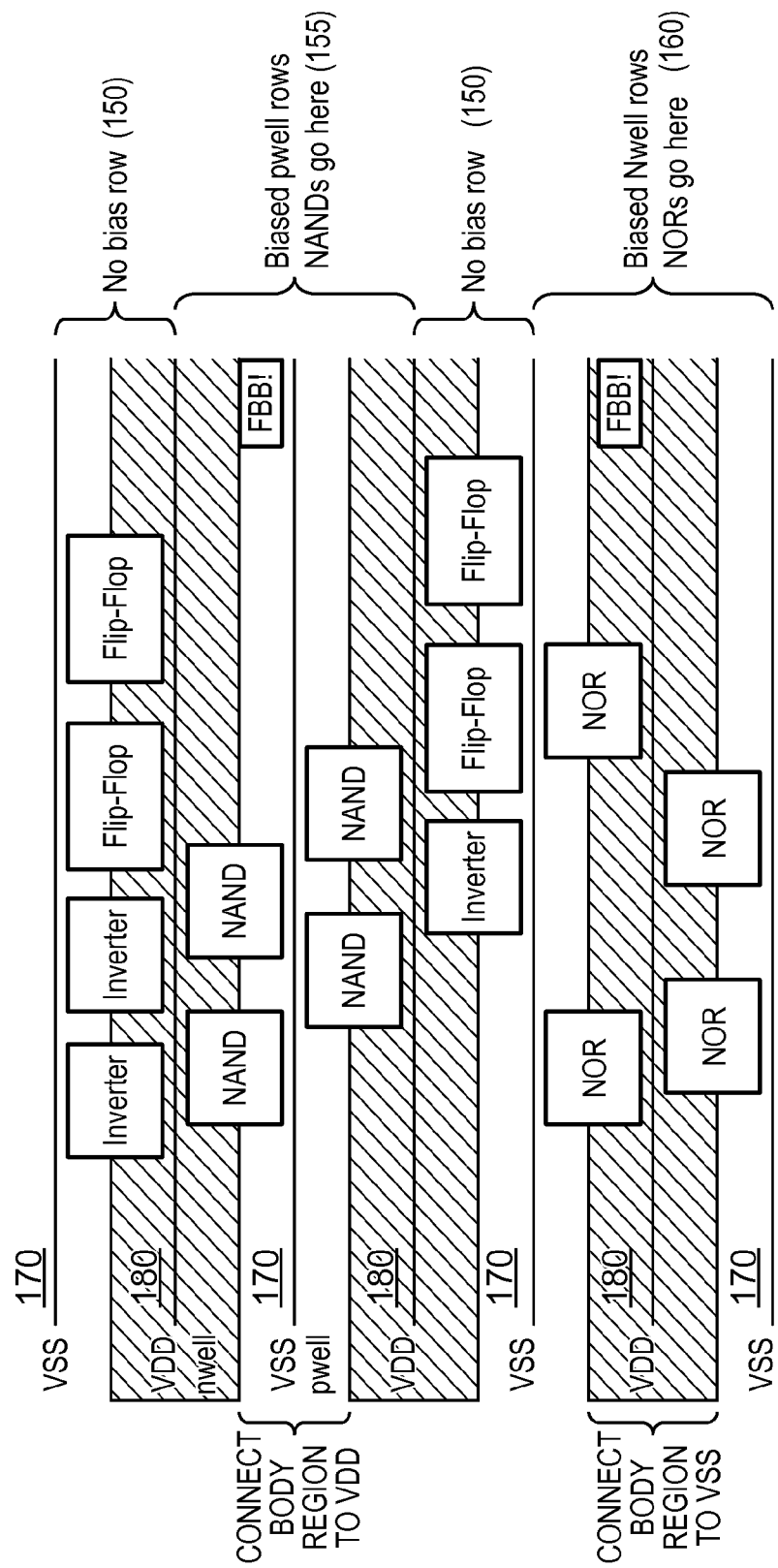
FIG. 3 schematically illustrates a standard cell placement scheme in accordance with one embodiment.

In accordance with one embodiment, a technique for generating the layout of a circuit block is provided, that provides particular rows that have either the p-well or the n-well forward body biased, and with the placement technique then constraining certain types of standard cells to be placed within those rows in order to allow a significant increase in switching speed with only a minimal increase in leakage current. This is shown schematically in FIG. 3. In particular, FIG. 3 shows a repeating pattern of six standard cell rows that may be employed in one embodiment. Two of the six rows 160 have a forward biased n-well, two of the six rows 155 have a forward biased p-well, and two of the standard cell rows 150 have no bias. In the example of FIG. 3, it is assumed that a flipped cell arrangement is used so as to enable the power supply lines and ground supply lines to be shared between adjacent rows. The standard cell rows extend between adjacent VSS and VDD lines, and the p-wells 170 and n-wells 180 can be seen to be shared between adjacent rows. Considering the pair of rows 155 that share a body biased p-well 170, it will be recalled from FIG. 1B that the p-well will be used by the NMOS devices. In a NAND device, it will be seen from FIG. 2A that it is the NMOS devices that are stacked, and accordingly if NAND gate standard cells are placed within the two rows 155, this can significantly increase the switching speed of the NAND gates without a significant increase in leakage current (due to the main contributors to leakage current within the NAND gates being the PMOS devices that are instantiated within the adjacent n-wells 180, the n-wells not being forward body biased).

Similarly, considering the pair of rows 160, it can be seen that these share a forward body biased n-well 180. From FIG. 1B, it will be recalled that the n-well is used for p-type transistors, and from FIG. 2B it will be seen that a NOR gate uses a stacked arrangement of PMOS transistors. Accordingly, if NOR gates are placed within these rows 160, this will give rise to a significant increase in the switching speed of the NOR gates, without any significant increase in leakage current (due to the fact that the parallel arrangement of NMOS transistors used in each NOR gate are instantiated within the adjacent p-wells 170 that do not have any forward body bias applied to them).

The non-biased rows can then be used for placement of various other standard cells such as inverters or complex cells like flip-flops.

When using an arrangement such as shown in FIG. 3, these rows can all abut as usual for good density, on the condition that the row height is greater than the hot n-well spacing. Hence, by way of example, in 65 nm technology, a ten track row height may be the minimum row height that would be legal.

Hence, in accordance with the above described layout generation technique, input data (for example in the form of a gate level netlist) is provided identifying the plurality of circuit elements and the interconnections between those circuit elements required to implement a desired circuit block. A plurality of standard cell rows are then formed within which to place standard cells from the standard cell library in order to implement the circuit block, the individual standard cells being placed within the rows having regard to the circuit elements identified in the input data and the required interconnections. However, in addition, the plurality of rows include at least one body biased row in which a body bias is supplied in respect of either the n-type transistors or the p-type transistors provided by the standard cells placed in that body biased row. In the example shown in FIG. 3, each repeating pattern of six rows includes two p-well biased rows and two n-well biased rows. Further, constraint data is then specified identifying a subset of the standard cells that are allowed to be placed in each body biased row. In one embodiment, the constraint data may identify a certain subset of standard cells which must always be placed within a particular associated body biased row. Alternatively, the subset of standard cells identified may be a subset that are allowed to be placed within such rows, hence limiting which standard cells can be placed within the rows, but allowing some flexibility to also include such standard cells in other rows, for example if that would assist implementing the routing requirements specified by the input data.

Hence, at the time the layout is generated, the tool not only places standard cells within the rows having regard to the input data, but in addition takes account of where each body biased row is provided, and the constraint data for each body biased row. Whilst this approach will place some additional constraints on inter-cell routing, due to the fact that certain cells may be constrained to be placed in particular rows, it has been found that this does not present a significant problem for power or routability in many instances, and gives rise to some very significant increases in switching speed, hence significantly increasing performance.

Figure 4:
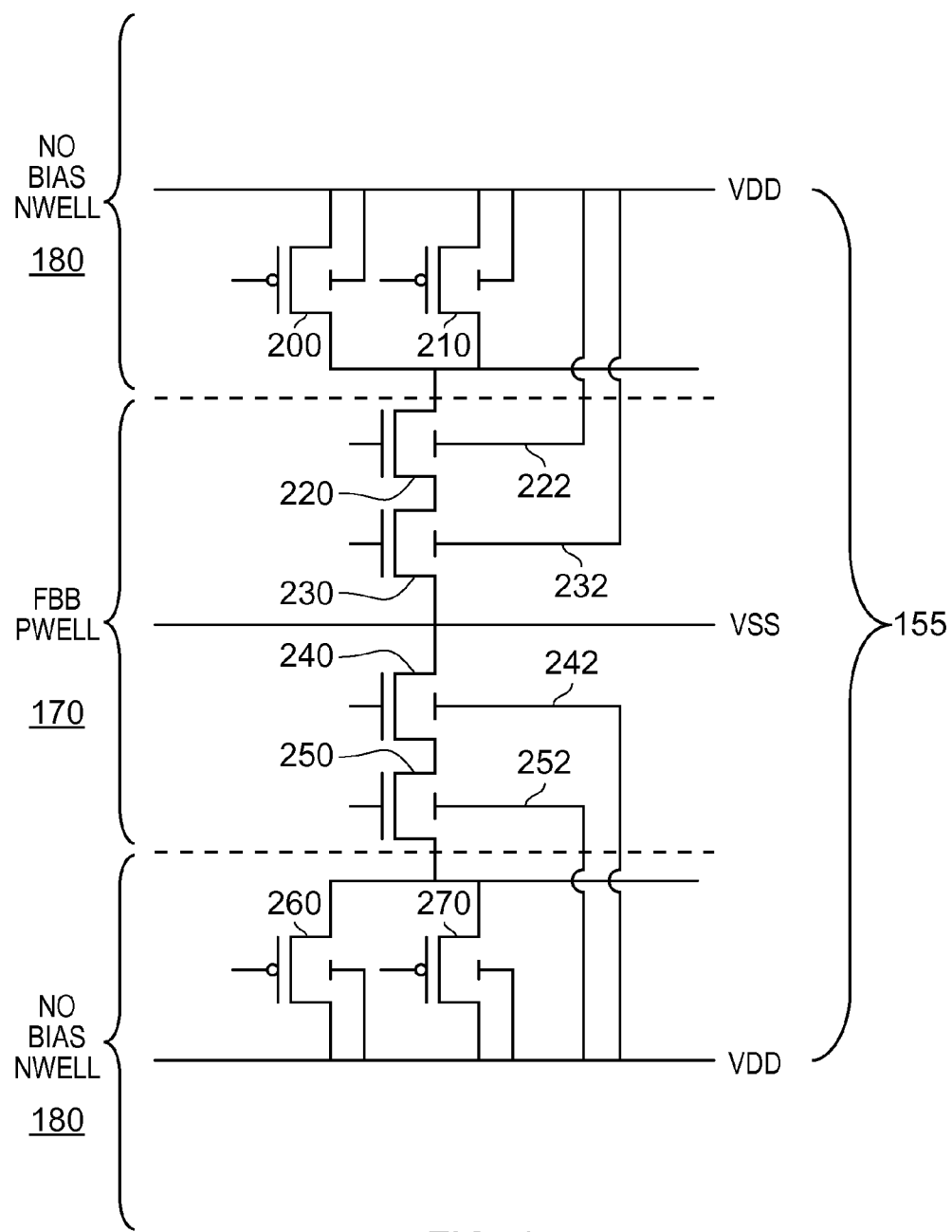
FIG. 4 illustrates the body biasing applied in respect of NAND gates sharing a forward body biased p-well in accordance with one embodiment.

FIG. 4 schematically illustrates the provision of NAND gates within the two forward biased p-well rows 155 of FIG. 3. In the first row, a NAND gate is formed by two PMOS transistors 200, 210 and two NMOS transistors 220, 230, whilst in the second row a NAND gate is formed by two PMOS transistors 260, 270 and two NMOS transistors 240, 250. As shown, the various NMOS transistors 220, 230, 240, 250 are placed within the forward body biased p-well 170, and hence have their body bias connections 222, 232, 242, 252, respectively, connected to the supply voltage VDD. In contrast, the PMOS transistors 200, 210, 260, 270 have no body bias supplied, and accordingly their body bias terminals are connected to the supply voltage VDD. A similar configuration can be provided for NOR gates in the forward body biased n-well rows 160, where the stacked PMOS transistors in each NOR gate are forward body biased by connecting their body bias terminals to the ground supply VSS, and the parallel NMOS devices have no bias applied, again by connecting their body bias terminals to the ground supply VSS.

As discussed earlier with reference to FIG. 1B, when seeking to apply body biases in respect of NMOS devices, it may be necessary to form a deep n-well 70 to separate the p-well 65 from the rest of the substrate, in order to allow a row of transistors sharing that p-well to be body biased. Such a configuration of p-well 65 and associated deep n-well 70 is referred to as a triple well structure. If such a triple well structure is undesirable for cost reasons, then in one embodiment it is possible to adopt an alternative row pattern to that shown in FIG. 3, where only the n-wells are forward body biased.

Also considering the example of FIG. 3, it will be appreciated that it is possible to alter the number of biased p-well rows, biased n-well rows and non-biased rows. For example, it would be possible to add more unbiased rows as required, e.g. for designs having higher proportions of flip-flops. If desired, it would also be possible to add a number of rows where both the p-wells and the n-wells were forward body biased if desired.

Figure 5:
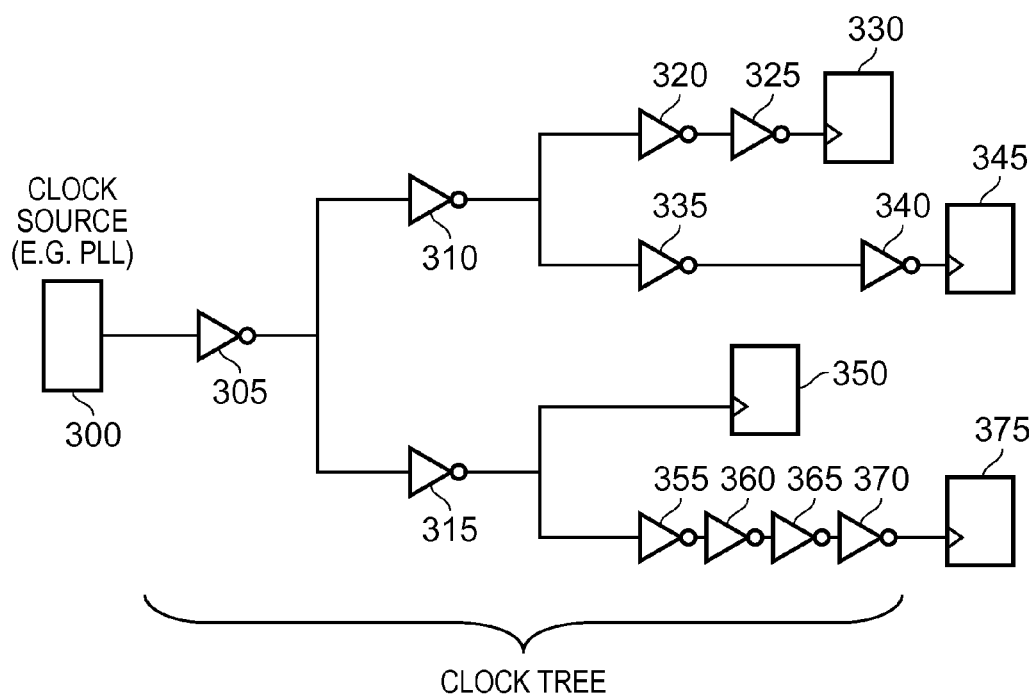
FIG. 5 schematically illustrates a clock tree structure.

Whilst the above embodiment has been described with reference to standard cells that have stacked transistor arrangements, it can also be usefully applied in respect of other standard cells that do not include such stacked transistors. One example are the standard cells that represent the inverters used in a clock tree. Such a clock tree is shown in FIG. 5. As shown, a clock source 300 such as a phase locked loop (PLL) issues a signal which is disseminated via a tree of inverters 305, 310, 315, 320, 325, 335, 340, 355, 360, 365, 370 to a number of storage elements (such as flip-flops) 330, 345, 350, 375. In the clock tree design, it is desired to improve the rising edge transition times in order to thereby improve robustness. In one embodiment, this can be achieved by placing the inverters used in the clock tree within a suitably forward biased row so as to allow the PMOS devices in the inverter to be forward body biased.

Figure 6:
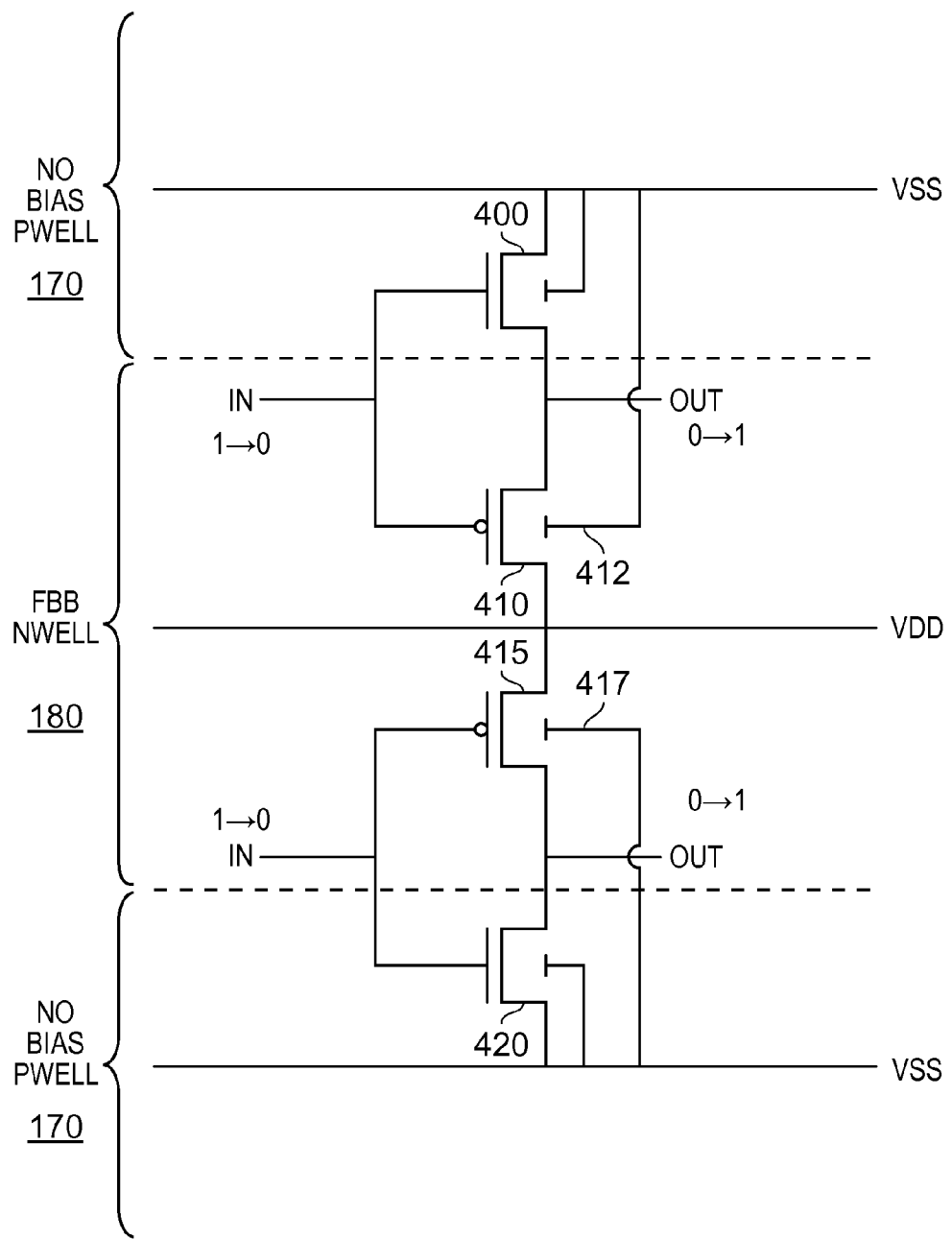
FIG. 6 schematically illustrates how the inverters used in a clock tree structure may be located within a forward body biased n-well in accordance with one embodiment.

Such an arrangement is shown in FIG. 6 where a pair of rows share a forward body biased n-well in which the PMOS devices are formed. Hence, an inverter in the first row formed by the transistors 400, 410 will have its PMOS transistor 410 placed within the forward body biased n-well 180, whilst the NMOS transistor 400 is formed within a p-well 170 that is not body biased. Similarly, an inverter in the adjacent second row has its PMOS transistor 415 placed within the forward body biased n-well, whilst the associated NMOS transistor 420 is formed in the unbiased p-well. The forward body bias is supplied to the PMOS devices 410, 415 by virtue of the corresponding body bias connection 412, 417 being provided to the ground supply VSS. The NMOS transistors 400, 420 are unbiased by virtue of their body bias connection also being connected to VSS.

Figure 7:
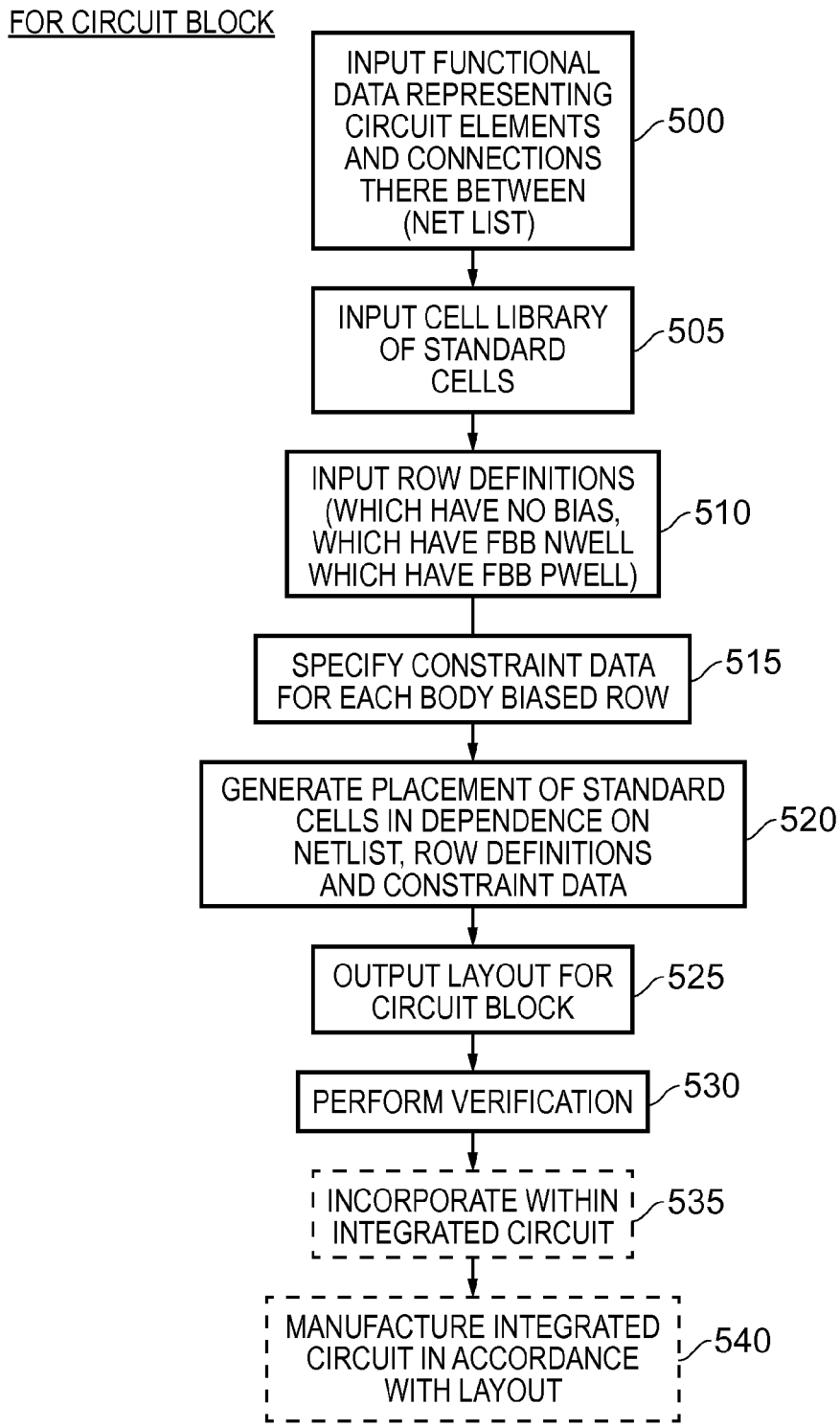
FIG. 7 is a flow diagram illustrating a method in accordance with one embodiment.

FIG. 7 is a flow diagram illustrating a computer implemented method of generating a layout of a circuit block in accordance with one embodiment. At step 500, functional data representing the circuit elements and connections therebetween in order to implement the circuit block is input, for example as a netlist. At step 505, a cell library of standard cells is also input for use by the method in generating the layout of the circuit block.

At step 510, the row definitions are input, in one embodiment this defining the repeating pattern of rows such as that discussed earlier with reference to FIG. 3, and in particular identifying which rows have no bias, which rows have a forward body biased n-well, and which rows have a forward body biased p-well. As discussed earlier, if desired one or more rows may also be provided that have both the n-well and the p-well forward body biased.

At step 515, constraint data is specified for each body biased row. In particular, such constraint data will identify a subset of the standard cells that are allowed to be placed in each body biased row. Considering the earlier example of FIG. 3, this may for example identify certain NAND gate standard cells that are constrained to be used within the rows 155, and certain NOR gate standard cells that are constrained to be used within the rows 160.

In one embodiment, the input data at step 500 identifies for each circuit element the actual standard cell within the standard cell library to be used. In addition, the standard cell library may provide multiple versions of particular standard cells, and hence may provide a particular standard cell version that is constrained to be used in a particular body biased row. Hence, with reference to the example of FIG. 3, there may be a particular NAND gate standard cell that is constrained to be used within a p-well biased row 155. In such an arrangement, it can be seen that the constraint data is effectively specified by the standard cell, in combination with the input data.

However, in an alternative embodiment the constraint data may specified by user input, i.e. by the user operating the computer implemented method in order to generate the layout of the circuit block. Hence, the user may specify for example that NAND gates are to be constrained to be placed within the rows 155.

Following step 515, then at step 520 the computer implemented tool generates the placement of standard cells within the various defined rows in dependence on the input data (e.g. the netlist), the row definitions and the constraint data. This results in the output of the layout for the circuit block at step 525, whereafter one or more standard verification steps can be performed at step 530, in order to ensure that the place and route process that has been performed has not introduced any unexpected anomalies.

In some instances, the circuit block whose layout is being generated by the preceding steps will be the entirety of the integrated circuit. However, in an alternative embodiment the circuit block may itself be a component of the integrated circuit, in which case at step 535 that circuit block can be incorporated within the integrated circuit design. It will be appreciated that this step can be achieved in a variety of ways, and may in fact involve reperforming the preceding steps 500 to 530 for a new set of input data representing the integrated circuit, where some of that input data effectively defines the layout of the circuit block just generated.

Once the integrated circuit layout has been finalised, then at step 540 the integrated circuit can be manufactured in accordance with the layout.

It will be appreciated that the layout can be output at step 525 in a variety of ways, but in one embodiment this step will involve recording the layout as layout data on a computer readable medium.

Whilst in one embodiment it may be arranged that each body biased row will always receive the determined body bias in respect of either the n-type transistors or the p-type transistors provided by the standard cells placed within that body biased row, in an alternative embodiment the design may be configured to allow the body bias to be selectively disabled in certain situations. For example, in one embodiment configuration circuitry may be provided in association with at least one body biased row to enable application of the body bias to be disabled in response to at least one predetermined condition. The predetermined condition can take a variety of forms, but may for example comprise an operating voltage exceeding a predetermined level, or a power gating operation being applied to the circuit block containing the body biased row(s).

By such an approach, if it is desired to operate the circuit block at an operating voltage above a certain level, for example at above the near or sub-threshold operating voltages, the body biasing can be turned off. For example, considering the full forward-bias embodiment, it is desirable to disable forward body biasing when scaling the voltage above such near or sub-threshold operating voltages (for example in one particular embodiment when scaling the supply voltage above 500 to 600 mV), as otherwise it is possible to cause damage to the integrated circuit by large substrate currents and/or latchup.

As another example, it is possible to disable the body biasing when a power gating operation is being performed, for example when the circuit block is being clock gated such that the clock signal to the circuit block is stopped for a period of time. During such a period of time, it would be desirable to disable forward body biasing, as during that period of time the forward body biasing will be contributing to leakage current, without any improvement in switching speed being observed due to the circuit block being turned off.

There are a number of ways to implement the configuration circuitry. However, considering the earlier described embodiment where forward biasing is applied to an n-well by connecting the n-well to a ground supply VSS, and no bias is applied to an n-well by connecting the n-well to the supply voltage VDD, then the voltage provided to the n-well (typically via a buffer) can merely be switched from the ground supply VSS to the supply voltage VDD in order to switch the bias off when desired. Similarly, considering the earlier described embodiment where forward biasing is applied to a p-well by connecting the p-well to the supply voltage VDD, and no bias is applied to a p-well by connecting the p-well to the ground supply VSS, then the voltage provided to the p-well (again typically via a buffer) can merely be switched from the supply voltage VDD to the ground supply VSS in order to switch the bias off when desired.

Figure 8:
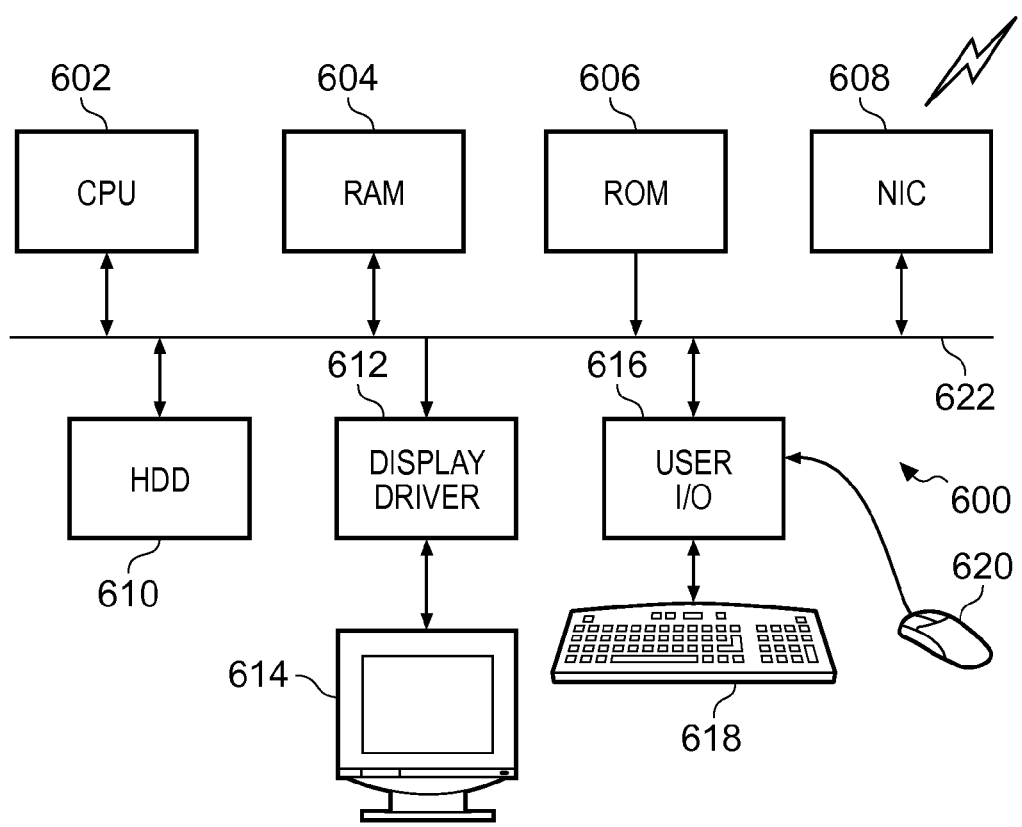
FIG. 8 schematically illustrates a general purpose computer of the type which can be used to implement the present techniques.

FIG. 8 schematically illustrates a general purpose computer 600 of the type that may be used to implement the above described techniques, and in particular the generation of a layout of a circuit block for an integrated circuit. The general purpose computer 600 includes a central processing unit 602, a random access memory 604, a read-only memory 606, a network interface card 608, a hard disk drive 610, a display driver 612 and monitor 614, and a user input/output circuit 616 with a keyboard 618 and mouse 620 all connected via a common bus 622. In operation the central processing unit 602 will execute computer program instructions that may be stored in one or more of the random access memory 604, the read-only memory 606 and the hard disk drive 610, or dynamically downloaded via the network interface card 608.

The results of the processing performed may be displayed to a user via the display driver 612 and the monitor 614. User inputs for controlling the operation of the general purpose computer 600 may be received via the user input/output circuit 616 from the keyboard 618 or the mouse 620. It will be appreciated that the computer program could be written in a variety of different computer languages. The computer program may be stored and distributed on a recording medium or dynamically downloaded to the general purpose computer 600. When operating under control of an appropriate computer program, the general purpose computer 600 can perform the above described layout generation techniques and can be considered to form an apparatus for performing the above described techniques. The architecture of the general purpose computer could vary considerably, and FIG. 8 is only one example.

It has been found that by using the above described techniques, a significant increase in switching speed can be achieved over an unbiased well design, with only a minor increase in leakage current. Further, a significant proportion of the speed up gain that would result from body biasing both the p-wells and the n-wells can be achieved when adopting the embodiments described herein, but with a very significantly reduced leakage power and total energy cost, when compared with an implementation where both the p-wells and the n-wells are body biased in each row.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims.

For example, various combinations of the features of the dependent claims could be made with the features of the independent claims without departing from the scope of the present invention.

I claim:

1. A computer-implemented method of generating a layout of a circuit block of an integrated circuit, comprising:
   receiving input data identifying a plurality of circuit elements and interconnections required to implement the circuit block;
   accessing a cell library providing a plurality of standard cells, each standard cell defining a corresponding circuit element using transistors, the transistors comprising n-type transistors and p-type transistors;
   forming a plurality of rows within which to place standard cells from the cell library in order to implement the circuit block, said plurality of rows including at least one body biased row in which a body bias is to be applied in respect of one type of the n-type transistors and the p-type transistors provided by the standard cells placed in that body biased row;
   specifying constraint data identifying a subset of the standard cells that are allowed to be placed in each body biased row; and
   generating said layout by placing standard cells within the plurality of rows having regard to the input data, an indication of each body biased row and the constraint data for each body biased row wherein the constraint data identifies as the subset of standard cells at least one standard cell that includes a series of transistors of the one type that are arranged in a stacked arrangement.

2. A method as claimed in claim 1, wherein said constraint data identifies as said subset of standard cells at least one standard cell used as a circuit element within a clock distribution tree used to propagate a clock signal.

3. A method as claimed in claim 1, wherein said body bias to be applied within each body biased row is a forward body bias.

4. A method as claimed in claim 1, wherein said at least one body biased row comprises a p-type body biased row in which a body bias is to be applied in respect of the p-type transistors provided by standard cells placed in that p-type body biased row, and no body bias is to be applied in respect of the n-type transistors provided by standard cells placed in that p-type body biased row.

5. A method as claimed in claim 4, wherein said subset of the standard cells identified by said constraint data comprises at least one standard cell that includes a series of p-type transistors that are arranged in a stacked arrangement within that standard cell.

6. A method as claimed in claim 4, wherein said body bias is to be applied by providing a reference voltage level to a body connection of the p-type transistors within the p-type body biased row.

7. A method as claimed in claim 1, wherein said at least one body biased row comprises an n-type body biased row in which a body bias is to be applied in respect of the n-type transistors provided by standard cells placed in that n-type body biased row, and no body bias is to be applied in respect of the p-type transistors provided by standard cells placed in that n-type body biased row.

8. A method as claimed in claim 7, wherein said subset of the standard cells identified by said constraint data comprises at least one standard cell that includes a series of n-type transistors that are arranged in a stacked arrangement within that standard cell.

9. A method as claimed in claim 7, wherein said body bias is to be applied by providing a supply voltage level to a body connection of the n-type transistors within the n-type body biased row.

10. A method as claimed in claim 1, wherein the input data identifies for each circuit element the standard cell within the standard cell library to be used for that circuit element.

11. A method as claimed in claim 10, wherein said constraint data is specified within the standard cell library by provision of one or more standard cells that are constrained to be used in said at least one body biased row.

12. A method as claimed in claim 1, wherein the constraint data is specified by user input.

13. A method as claimed in claim 1, wherein the constraint data identifies that all instances of the subset of standard cells must be placed within said at least one body biased row.

14. A method as claimed in claim 1, wherein said step of forming a plurality of rows within which to place standard cells from the cell library in order to implement the circuit block comprises:
  repeating in a regular pattern a multiple of two p-type body biased rows and a multiple of two n-type body biased rows separated by one or more non-biased rows.

15. A method as claimed in claim 1, further comprising the steps of:
  incorporating the layout of the circuit block within a layout of an integrated circuit; and
  manufacturing the integrated circuit from the layout of the integrated circuit.

16. A method as claimed in claim 1, further comprising associating configuration circuitry with said at least one body biased row to enable application of the body bias to be disabled in response to at least one predetermined condition.

17. A method as claimed in claim 16, wherein said at least one predetermined condition comprises one of an operating voltage exceeding a predetermined level and a power gating operation being applied to said at least one circuit block.

18. A computer program product stored on a non-transitory, computer-readable storage medium for controlling a computer to perform a method of generating a layout of a circuit block as claimed in claim 1.

19. A non-transitory, computer-readable storage medium storing a cell library comprising a plurality of standard cells, each standard cell defining a corresponding circuit element using transistors, the transistors comprising n-type transistors and p-type transistors, the standard cell library including a subset of standard cells constrained to be used in a body biased row of a plurality of rows to be populated with standard cells from the cell library in order to implement a circuit block, the body biased row being a row in which a body bias is to be applied in respect of one type of the n-type transistors and the p-type transistors provided by standard cells placed in that body biased row wherein the subset of standard cells includes at least one standard cell having a series of transistors of the one type that are arranged in a stacked arrangement.

20. An integrated circuit comprising:
  at least one circuit block comprising a plurality of circuit elements formed from standard cells of a cell library and positioned within a plurality of rows, the circuit elements comprising p- type transistors and n-type transistors;
  said plurality of rows including at least one body biased row in which a body bias is applied in respect of one type of the n-type transistors and the p-type transistors provided by the circuit elements positioned in that body biased row; and
  each body biased row containing only circuit elements formed from standard cells within a subset of the standard cells that are constrained to be placed in that body biased row, dividing said fixed layout of the integrated circuit into a number of regions,
  wherein the subset of standard cells includes at least one standard cell having a series of transistors of the one type that are arranged in a stacked arrangement.

21. An integrated circuit as claimed in claim 20, further comprising configuration circuitry responsive to at least one predetermined condition to disable the body bias applied to said at least one body biased row.

22. An integrated circuit as claimed in claim 21, wherein said at least one predetermined condition comprises one of an operating voltage exceeding a predetermined level and a power gating operation being applied to said at least one circuit block.

* * * * *